United States Patent [19]

McLyman

[11] Patent Number: 4,823,074
[45] Date of Patent: Apr. 18, 1989

[54] LOW POWER CONSUMPTION CURRENT TRANSDUCER

[75] Inventor: Colonel W. T. McLyman, South Pasadena, Calif.

[73] Assignee: The United States of America as represented by the Administrator of the National Aeronautics and Space Administration, Washington, D.C.

[21] Appl. No.: 133,412

[22] Filed: Dec. 15, 1987

[51] Int. Cl.⁴ .............................................. G01R 1/20
[52] U.S. Cl. .............................. 324/117 R; 324/127; 330/8
[58] Field of Search ............... 324/117 R, 127; 330/8; 307/414, 416

[56] References Cited

U.S. PATENT DOCUMENTS

| | | | |
|---|---|---|---|
| 3,422,352 | 1/1969 | Paulkovich | 324/117 R |
| 3,959,695 | 5/1976 | Shimp | |
| 4,152,744 | 5/1979 | Pang | 361/94 |
| 4,271,462 | 6/1981 | Peters | 363/84 |

*Primary Examiner*—Ernest F. Karlsen
*Attorney, Agent, or Firm*—Thomas H. Jones; John R. Manning; Paul F. McCaul

[57] ABSTRACT

A low power consumption current transducer utilizes a saturable core reactor which includes a pair of opposed gate windings and a control winding. The control winding of the saturable reactor is arranged to receive the current to be measured. A square wave generator is connected to the gate windings via a transformer with the primary winding of the transformer connected across the square wave generator and the secondary connected in series with the gate windings of the reactor. A full wave rectifier is connected to the gate windings and a resistor is connected across the rectifier to provide a DC voltage thereacross representative of the current flow through the control winding. A DC power supply is provided to supply power to the square wave voltage source. A diode is connected between each end of the primary winding of the transformer and one polarity of the DC power supply to commutate the reactive current resulting from the counter emf generated in the reactor back to the DC supply to eliminate potentially damaging reactive voltage spikes which would otherwise appear at the output of the square wave generator and conserve energy.

14 Claims, 2 Drawing Sheets

LOW POWER CONSUMPTION CURRENT TRANSDUCER

BACKGROUND OF THE INVENTION

1. Origin of the Invention

The invention described herein was made in the performance of work under a NASA contract, and is subject to the provisions of public law 96-517 (35 USC 202) in which the Contractor has elected not to retain title.

2. Field of the Invention

The present invention relates to current measuring instruments and more particularly to low power consumption current transducer which employs a saturable reactor.

3. Description of the Prior Art

Saturable core reactors have been utilized as variable impedance devices in the prior art to detect current flowing in an operating circuit (e.g. battery charging circuit etc.) and provide isolation of the output signal representing the current being measured and the operating circuit. The reactors are conventionally provided with two gate windings and a control winding. A source of alternating current (AC) and typically having a sine wave output is supplied to the gate windings and the control winding is connected to the operating circuit to receive the current (direct current or DC) to be measured. The DC current in the control winding moves the zero axis for the electromagnetomotive force (emf) produced by the current in the gate windings along the magnetization curve toward the saturation region, thereby reducing the counter emf produced in the gate windings and the inductance of the reactor. The greater the current in the control winding, the smaller the inductance within a given range of current values and vice versa.

The current flowing in the gate windings is usually rectified and supplied to a resistance element to provide a DC voltage proportional to the current in the control winding. The reactive component generated in the gate windings of the saturable reactor produce voltage spikes which appear at the AC source. These voltage spikes are particularly troublesome for high impedance AC voltage sources such as digital sources which provide a square wave output. Typically such sources cannot absorb the reactive component generated voltage spikes which spikes not only waste power but may damage the AC voltage source.

There is a need for a reliable low power consumption saturable reactor current transducer.

SUMMARY OF THE INVENTION

A low power consumption current transducer in accordance with the present invention includes a variable impedance circuit having an input, an output and a saturable core reactor. At least one gate winding and a control winding are wound on the core. The gate winding is connected in series with an AC voltage source which is arranged to generate a substantially square wave output signal. The control winding is arranged to receive the current to be measured.

An output circuit including a first rectifying means (e.g. in the form of a full wave bridge rectifier) is connected to the output of the variable impedance circuit for providing a DC output voltage representative of the current flow through the gate winding. Second rectifying means (e.g. in the form of a pair of diodes) is coupled between the input of the variable impedance circuit and a DC power supply (which may provide power for the AC voltage source) for commutating the reactive current resulting from the counter emf generated in the reactor back to the DC supply.

The features of the present invention, which are believed to be novel, are set forth in the appended claims. This invention as to its organization and advantages may best be understood by reference to the following description taken in conjunction with the accompanying drawing.

DESCRIPTION OF THE PREFERRED EMBODIMENT

Figure 1:
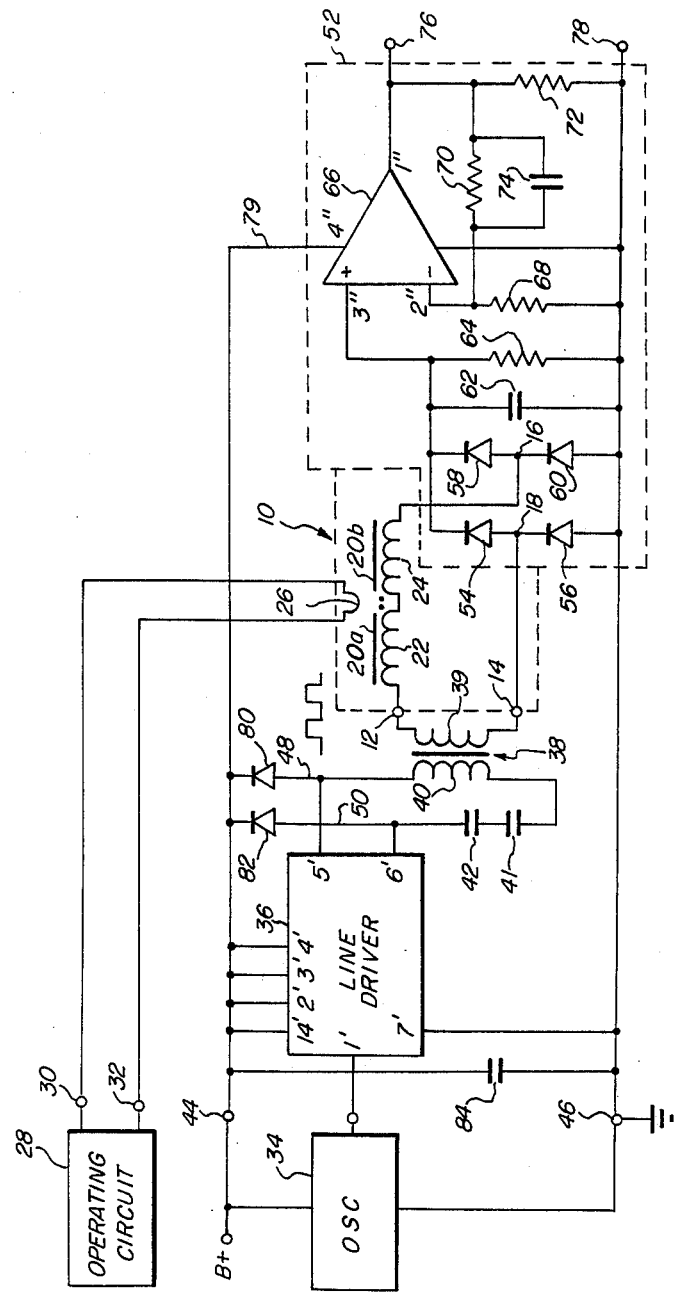
FIG. 1 is a schematic circuit diagram of a current transducer in accordance with the present invention.

Referring now to the drawings, and more particularly to FIG. 1, a variable impedance circuit 10 includes an input (terminals 12 and 14), an output (terminals 16 and 18), and a saturable core reactor 20. The saturable core reactor 20 comprises a pair of gate windings 22 and 24 wound on matched magnetic cores (illustrated diagramatically at 20a and 20b) and a control winding 26 wound on both cores so that the AC fluxes resulting from the current in the gate windings oppose in the sections of the cores common to the control winding to prevent any AC voltage from being induced in the control winding.

The control winding 26 is connected to an operating circuit 28 (or in series with a conductor) via terminals 30 and 32 so that the DC current in the operating circuit which is to be measured flows through the control winding. A source of AC voltage such as an oscillator 34 is connected to the input terminals 12 and 14 of the variable impedance circuit 10 via a line driver 36, transformer 38 and capacitors 41 and 42. The output of the oscillator 34 is a square wave having a frequency within the range of about 60 Hz to 100 KHz depending upon the configuration of turns on the saturable core reactor 20 and the resulting resonant frequency thereof. Preferably the frequency range of the square wave output signal is between 1-10 KHz.

The oscillator 34 may conveniently obtain power from a DC power supply or voltage source designated by a positive bus bar 44 and a negative or ground bus bar 46. The line driver 36 transforms the AC output from the oscillator 34 into a totem pole output on leads 48 and 50 as will be explained in more detail. The transformer 38 includes a primary winding 40 connected in series with the capacitors 41 and 42 to output leads 48 and 50 of the line driver 36 as shown. The line driver 36 also receives power from the DC source (44, 46) via terminals 14', 2', 3', 4' and 7' which terminal numbers correspond to the numbered terminals on line driven chip part No. MM88C301 manufactured by the National Semiconductor Corp. Terminals 1', 5' and 6' also correspond to terminal numbers on the chip. The capacitors 41 and 42 prevent DC from flowing through the primary winding 40 in case the oscillator 34 fails.

It should be noted that the line driver 36 can be connected to function as its own oscillator where synchronization of several components is not required. In this case the capacitors 41 and 42 can be eliminated.

An output circuit 52 includes a first rectifier comprising diodes 54, 56, 58 60 connected in a full wave bridge configuration, a smoothing capacitor 62 a current to voltage converting element in the form of resistor 64 and an operational amplifier 66 with attendant resistance/capacitance components 68, 70, 72 and 74, as shown. The output of the amplifier 66 is applied across terminals 76 and 78. The operational amplifier also receives its power requirements from the DC source via lead 79. The terminals marked 1", 2", 3", 4" and 11" correspond to like numbered terminals on chip part No. LM124 manufactured by National Semiconductor Corp.

A second rectifier means, in the form of a pair of commutating diodes 80 and 82, is connected between the leads 48 and 50 and the positive bus of the DC power supply as shown. These diodes function to conduct feedback current resulting from the voltage spikes generated by the reactive component in the saturable core reactor 20 back to the DC voltage source. A storage capacitor 84 functions to store the charge resulting from such feedback current for supplementing the power furnished by the DC source.

Figure 2:
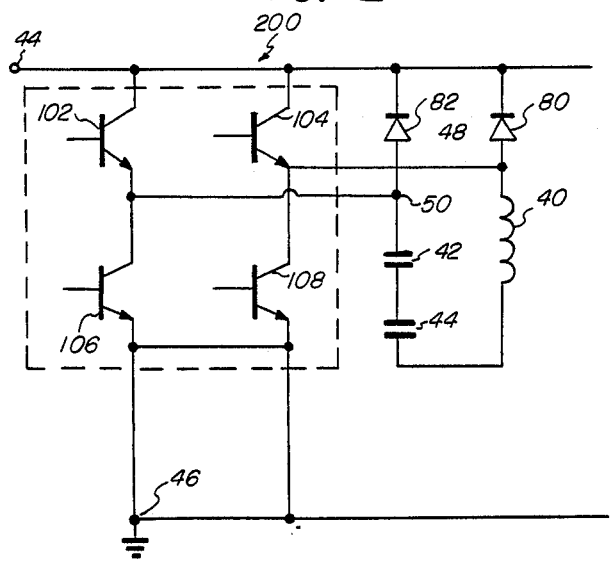
FIG. 2 is a schematic circuit diagram of a transistor bridge circuit for providing a totem pole output signal of the type produced by the AC voltage source of FIG. 1.

Referring now to FIG. 2 a transistor bridge circuit 200 for providing a totem pole output of the type produced by the line driver 36 is illustrated. The bridge circuit comprises a pair of source transistors 102 and 104 and a pair of drain transistors 106 and 108 connected as shown. Transistors 102 and 108 are operated during one-half cycle of the square wave output, and the transistors 104 and 106 are operated during the other half cycle to sandwich the output square wave between the positive and negative values of the DC supply as is well-known to those skilled in the art.

In operation, without current flowing through the control winding, the inductance of the saturable reactor 20 is at a maximum, and the current flowing through the gate windings will be at a minimum, e.g. only magnetizing current for the saturable reactor. At this time the voltage across the resistor 64 and output terminals 76 and 78 will also be at a minimum. As the current through the control winding 26 increases the inductance of the reactor will decrease and the current through the gate windings and the output voltage will increase proportionally. Feedback current resulting from the voltage spikes due the counter emf of the saturable core is conducted or commutated back to the DC voltage source (44, 46) via diode 80 and 82. The commutating diodes 80 and 82 not only reduce the power requirements of the current transducer but prevent the feedback voltage spikes from damaging the line driver 36.

By way of example only, I have ascertained that a current transducer constructed of the following components will produce an output (at terminals 76, 78) of 0–3 volts for an input current (in control winding 26) of 0–15 amperes and with a 2.3 KHz square wave signal of 0–5 volts on leads 48 and 50.

| COMPONENT | IDENTIFICATION |
|---|---|
| Line Driver 36 | National Semiconductor Part No. MM88C301. |
| Transformer 38 | Primary winding of 408 turns of No. 34 copper wire interleaved and progressively wound through a span of 350° with the secondary winding of 660 turns (same wire size and same 350° span) on an 80/20 nickel-iron core. One-half of the primary and secondary turns are rotated 180° with respect to the other half. |
| Saturable reactor 20 | Two cores of 80/20 nickle iron; with one turn of the control winding linking both cores. Each gate winding comprises 1500 turns wound progessively through 350° with one-half of the turns rotated through 180°. |
| Operational amplifier | National Semiconductor Part No. LM124 (Gain of 20 with bias and feedback resistors as set forth below). |
| Diodes 54, 56, 58, 60, 80 and 82 | National Semiconductor Part No. IN5619 |
| Capacitors | |
| 41 | 15 μf |
| 42 | 15 μf |
| 62 | 100 μf |
| 74 | .22 μf |
| 84 | 4.7 μf |
| Resistors | |
| 64 | 20Ω |
| 68 | 10KΩ |
| 70 | 146KΩ |
| 72 | 100KΩ |

A current transducer constructed with the above component had a quiescent current (0 input current in control winding 26) of 1.2 milliamperes (ma). With an input current of 10 and 15 amperes, the current drain was only 4.4 and 7.2 ma and the power consumed was 22 and 36 milliwatts, respectively.

Figure 3:
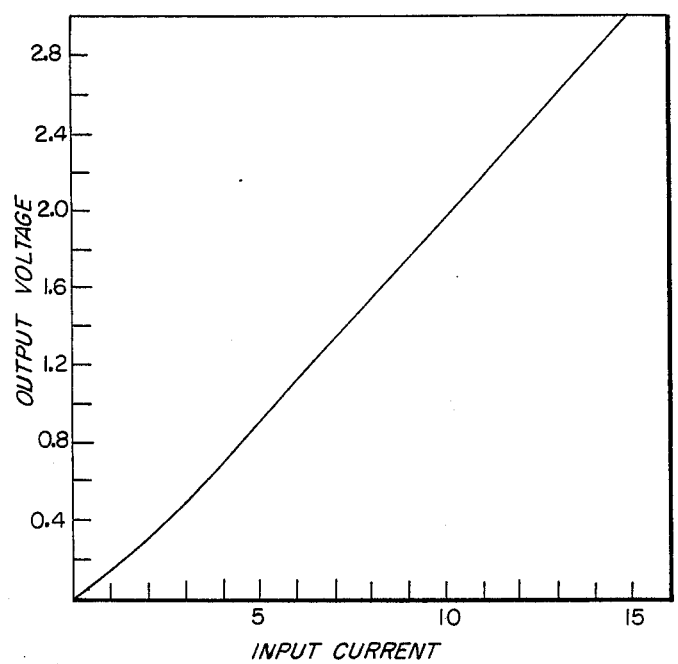
FIG. 3 is a plot of the output voltage vs. input current for the circuit of FIG. 1 utilizing specific components.

FIG. 3 is a plot of the input current and the output voltage of the current transducer constructed with the components described above. It should be understood that different components and different turn ratios on the transformer and saturable reactor may be used to provide any desired output voltage range vs. input current range.

There has been described a novel current transducer which provides an output isolated from the input and which has a lower power consumption. Various modifications will be apparent to those skilled in the art without involving any departure from the spirit and scope of my invention as set forth in the appended claims.

What is claimed is:

1. A low power consumption current transducer for providing an output representative of the current flowing in a conductor comprising:
    (a) variable impedance means having an input, an output and a saturable core reactor including at least one gate winding connected between the input and output and a control winding the control winding being adapted to receive the current flowing through said conductor;
    (b) a source of DC voltage;

(c) an AC voltage source connected to the input of the variable impedance means for applying a substantially square wave signal thereto;

(d) output means including first rectifying means connected to the output of the variable impedance means for providing a DC output voltage representative of the magnitude of the current flow through the gate winding; and (e) second rectifying means coupled between the input of the variable impedance means and the DC voltage source for commutating back to the DC source the reactive current resulting from voltage induced across the input of the variable impedance means by the saturable core, the saturable reactor and AC voltage source being arranged so that current through the control winding will cause the inductance of the reactor and the DC output voltage to change substantially linearly with changes in the current being measured over a predetermined range.

2. The current transducer of claim 1 including a transformer having a primary and a secondary winding, the secondary winding being connected across the input of the variable impedance means and the primary winding being connected to the AC voltage source.

3. The current transducer of claim 2 wherein the second rectifying means is connected between one polarity of the DC voltage source and each end of the primary winding of the transformer.

4. The current transducer of claim 3 further including capacitance means connected across the DC source to store at least a portion of the charge resulting from the commutation of the reactive current by the second rectifying means.

5. In a low power consumption current transducer for providing an output representative of the current flow in a working circuit, the combination which comprises:

(a) a variable inductance circuit having an input, an output and a saturable core reactor including a pair of gate windings connected in series between the input and output thereof and a control winding adapted to be coupled to the working circuit to receive a current therethrough which is proportional to the current in the working circuit;

(b) a source of DC voltage;

(c) an oscillator coupled to the input of the variable inductance circuit for applying a substantially square wave signal thereto;

(d) a current-to-voltage converting circuit including first rectifying means connected in the output of the variable inductance circuit for providing a DC output voltage proportional to the current flow through the gate windings;

(e) an amplifier coupled to the current-to-voltage converting circuit for amplifying the DC output voltage therefrom, and (f) second rectifying means coupled between the input of the variable inductance circuit and the DC voltage source for feeding back to the DC source the reactive current resulting from the counter EMF generated by the saturable core.

6. The current transducer of claim 5 including capacitance means connected across the DC voltage source to store at least a portion of the charge resulting from the reactive current fed back to the input of the variable inductance.

7. The current transducer of claim 6 including a transformer having a primary winding connected to the oscillator and a secondary winding connected across the input of the variable inductance circuit, the primary winding having a pair of end terminals.

8. The current transducer of claim 7 wherein the second rectifying means includes a diode individually connected between each terminal of the primary winding of the transformer and one polarity of the voltage source.

9. The current transducer of claim 5 wherein the oscillator is connected to the DC source for receiving power therefrom.

10. The current transducer of claim 9 wherein the oscillator is arranged to produce a substantially square signal having a frequency between about 60 Hz and 100 KHz.

11. The current transducer of claim 10 wherein the frequency of the square wave signal is within the range of 1 to 10 KHz.

12. A low power consumption current transducer for providing an output representative of the current flow in a working circuit comprising:

(a) a variable inductance circuit having an input, an output and a saturable core reactor including a pair of gate windings connected in series between the input and output and a control winding adapted to receive the current to be measured;

(b) a DC power supply having positive and negative terminals;

(c) a transformer having a primary winding and a secondary winding, the secondary winding being connected across the input of the variable inductance circuit;

(d) a square wave generator connected across the primary winding of the transformer for applying thereto a square wave voltage varying between the positive and negative values of the power supply voltage;

(e) a current-to-voltage converting circuit connected to the output of the variable inductance circuit for providing a DC output voltage proportional to the current flow through the gate windings; and (f) a rectifier individually connected between each end of the primary winding of the transformer and one of the terminals of the DC power supply for commutating reactive current induced in the primary winding by the saturable core reactor back to the power supply.

13. The current transducer of claim 12 further including at least one capacitor connected across the DC power supply terminals for storing at least a portion of the charge resulting from the commutated reactive current.

14. The current transducer of claim 13 wherein the rectifiers are connected to the positive terminal of the power supply.

* * * * *